(12) United States Patent
Scheuerell et al.

(10) Patent No.: US 12,567,798 B1
(45) Date of Patent: Mar. 3, 2026

(54) INVERTER CONTROL WITH VOLTAGE MODULATION AND CURRENT LIMITING

(71) Applicant: Cummins Power Generation Inc., Minneapolis, MN (US)

(72) Inventors: Michael James Scheuerell, Stillwater, MN (US); Oliver Daniel Wilson, Elk River, MN (US); Wangwei Zhou, Shoreview, MN (US); Denise Maria Christine Athaide, Minneapolis, MN (US)

(73) Assignee: Cummins Power Generation Inc., Minneapolis, MN (US)

( * ) Notice: Subject to any disclaimer, the term of this patent is extended or adjusted under 35 U.S.C. 154(b) by 237 days.

(21) Appl. No.: 18/243,411

(22) Filed: Sep. 7, 2023

Related U.S. Application Data

(63) Continuation of application No. 18/131,290, filed on Apr. 5, 2023, now abandoned.

(51) Int. Cl.
*H02M 7/5387* (2007.01)
*H02J 3/00* (2006.01)
(Continued)

(52) U.S. Cl.
CPC .................. *H02M 1/36* (2013.01); *H02J 3/00* (2013.01); *H02M 1/32* (2013.01);
(Continued)

(58) Field of Classification Search
CPC ............ H02M 1/36; H02M 1/38; H02M 1/32; H02M 1/322; H02M 1/325; H02M 1/126;
(Continued)

(56) References Cited

U.S. PATENT DOCUMENTS 4,465,943 A * 8/1984 Risberg .................. H02J 9/066
307/127
9,407,178 B2 8/2016 Yim et al.
(Continued)

FOREIGN PATENT DOCUMENTS

CN 104935008 A 9/2015
CN 104953618 9/2015
(Continued)

*Primary Examiner* — Nguyen Tran
(74) *Attorney, Agent, or Firm* — Foley & Lardner LLP

(57) ABSTRACT

Presented herein are systems, devices, and methods for inverter control. The device may include a computer-readable medium having instructions stored thereon. The device may include at least one processor configured to execute the instructions. The at least one processor may monitor for an initiation of a connection between an inverter and an electrical bus to convey electrical power. The at least one processor may engage, responsive to detection of the initiation, phase locked loop (PLL) control on the electrical power conveyed via the inverter to synchronize the inverter with the electrical bus. The at least one processor may determine that a synchronization between the inverter and the electrical bus is complete. The at least one processor may disengage, responsive to the determination that the synchronization is complete, the PLL control on the electrical power conveyed between the inverter and the electrical bus.

15 Claims, 5 Drawing Sheets

(51) Int. Cl.

| | | |
|---|---|---|
| *H02M 1/32* | (2007.01) | |
| *H02M 1/36* | (2007.01) | |
| *H02M 1/12* | (2006.01) | |
| *H03L 7/08* | (2006.01) | |

(52) U.S. Cl.
CPC ........ *H02M 7/53871* (2013.01); *H02M 1/126* (2013.01); *H03L 7/08* (2013.01)

(58) Field of Classification Search
CPC .. H02M 1/12; H02M 1/143; H02J 3/00; H02J 3/001; H02J 3/00125; H02J 3/007; H02J 3/0073; H03L 7/08; H03L 7/0802; H03L 7/0805
See application file for complete search history.

(56) References Cited

U.S. PATENT DOCUMENTS

| | | | |
|---|---|---|---|
| 11,101,741 B2 | 8/2021 | Zhang et al. | |
| 2005/0187752 A1* | 8/2005 | Colby ............... | H02M 7/53806 |
| | | | 703/19 |

FOREIGN PATENT DOCUMENTS

| | | | |
|---|---|---|---|
| CN | 106469915 A | 3/2017 | |
| CN | 106849135 B | 4/2019 | |
| CN | 112737386 A | 4/2021 | |
| CN | 110048455 B | 6/2021 | |

* cited by examiner

INVERTER CONTROL WITH VOLTAGE MODULATION AND CURRENT LIMITING

CROSS-REFERENCE TO RELATED APPLICATIONS

This application is a continuation of U.S. patent application Ser. No. 18/131,290, filed Apr. 5, 2023, the disclosure of which is incorporated by reference herein in its entirety.

TECHNICAL FIELD

The present disclosure relates generally to power systems, and in particular systems and methods for controlling inverters.

BACKGROUND

A power system can accept or relay electrical power from various power sources to one or more components electrically coupled therewith. In furtherance of conveying electrical power, the power system can convert the power from direct current (DC) to alternating current (AC), and vice-versa.

SUMMARY

The present disclosure relates to techniques for inverter control. A controller for an inverter may use a single proportional-integral (PI) voltage control loop. The PI voltage control loop may be configured to engage phase locked loop (PLL) for synchronization to a live bus upon startup of the inverter. The PI voltage control loop may then use normal modulation and disengage PLL after completion of the startup to achieve phase control as specified by a frequency droop control. In addition, the controller may include a current control loop to provide current limiting. The current control loop may be configured to take over from the voltage control to regulate the output to a desired maximum current, when an over-current condition occurs. The controller may also include an imbalanced load to compensate for three-phase (e.g., A-phase, B-phase, and C-phase) electric power. With this architecture, the controller can be easier to tune, with simple PI loops for P (proportional) and I (integral) gains, with one for voltage control, one for current limiter, and another for the imbalanced load. The controller may also be independent of an inverter current or voltage sense, thereby reducing hardware complexity and bulk.

At least one aspect is directed to a device for inverter control. The device may include a computer-readable medium having instructions stored thereon. The device may include at least one processor configured to execute the instructions. The at least one processor may monitor for an initiation of a connection between an inverter and an electrical bus to convey electrical power. The at least one processor may engage, responsive to detection of the initiation, phase locked loop (PLL) control on the electrical power conveyed via the inverter to synchronize the inverter with the electrical bus. The at least one processor may determine that a synchronization between the inverter and the electrical bus is complete. The at least one processor may disengage, responsive to the determination that the synchronization is complete, the PLL control on the electrical power conveyed between the inverter and the electrical bus.

In some embodiments, the at least one processor may generate an inverter command to apply the PLL control on a voltage component of a plurality of voltage components of the electrical power based on a frequency droop compensation. In some embodiments, the at least one processor may modify an inverter command to apply the PLL control on a voltage component of a plurality of voltage components of the electrical power based on a feedback identifying the voltage component of the electrical power.

In some embodiments, the at least one processor may pass an inverter command for a voltage component of a plurality of voltage components of the electrical power in a first domain, responsive to none of a plurality of current components of the electrical power in a second domain exceeding an over-current threshold. In some embodiments, the at least one processor may recalculate an inverter command for a voltage component of a plurality of voltage components of the electrical power in a first domain to maintain the electrical power, responsive to at least one of a plurality of current components of the electrical power in a second domain exceeding an over-current threshold.

In some embodiments, the at least one processor may convert a first inverter command for a voltage component of a plurality of voltage component from a first domain with remaining components of the plurality of voltage components set to null, to generate a second inverter command in second domain. In some embodiments, the at least one processor may apply compensation over a plurality of voltage components for an inverter command.

At least one aspect is directed to a system providing electrical power. The system may include a power source configured to provide electrical power to an electrical bus. The system may include an inverter structured to be coupled with the power source and the electrical bus. The inverter may convey the electrical power between the power source and the electrical bus. The system may include a voltage controller structured to be coupled with the inverter. The voltage controller may determine, responsive to an initiation of synchronization between the inverter and the electrical bus, an inverter command to enable phase locked loop (PLL) control on a voltage of the electrical power. The voltage controller may modify, responsive to a completion of the synchronization, the inverter command to disable PLL control on the voltage of the electrical power. The system may include a current limiter structured to be coupled with the voltage controller and the inverter. The current limiter may determine whether to adjust the inverter command based on a comparison between a current of the electrical power to an over-current threshold.

In some embodiments, the system may include a compensator structured to be coupled with the current limiter. The compensator may apply a bias over a plurality of voltage components for the inverter command. In some embodiments, the system may include a domain transformer structured to be coupled with the current limiter. The domain transformer may convert the inverter command from a direct-quadrature-zero (DQ0) domain to an ABC domain.

In some embodiments, the voltage controller may adjust the inverter command on a component of a plurality of components corresponding to the voltage of the electrical power based on a droop compensation command. In some embodiments, the current limiter may regulate a current of the electrical power based on a feedback identifying a plurality of components corresponding to the current of the electrical power.

In some embodiments, the current limiter may re-determine the inverter command to maintain a target power for the electrical power, responsive to the component exceeding the over-current threshold. In some embodiments, the power source may include at least one of a battery pack, a generator set, a renewable fuel source, a microgrid, or a power interface coupled with an external component. The power source may deliver the electrical power via the voltage controller and the current limiter to the electrical bus.

At least one aspect is directed to a method of stabilizing voltage output. A controller may detect an initiation of a synchronization between an inverter and an electrical bus to output electrical power. The controller may activate a phase locked loop (PLL) control on a voltage of the electrical power conveyed via the inverter to stabilize the voltage responsive to detection of the initiation. The controller may wait for a completion of synchronization between the inverter and the electrical bus. The controller may de-activate the PLL control on the voltage of the electrical power to output from the inverter to the electrical bus.

In some embodiments, the controller may generate an inverter command to indicate activation of the PLL control on a component of a plurality of components corresponding to the voltage based on a frequency droop compensation. In some embodiments, the controller may generate an inverter command to indicate deactivation of the PLL control on a component of a plurality of components corresponding to the voltage based on a load feedback for the component of the voltage.

In some embodiments, the controller may maintain deter-mination of activation of the PLL control responsive to none of a plurality of components corresponding to an exceeding an over-current threshold. In some embodiments, the con-troller may re-determine activation of the PLL control responsive to at least one of a plurality of components corresponding to a current of the electrical power exceeding an over-current threshold. In some embodiments, the con-troller may apply an imbalanced load over a plurality of components corresponding to the voltage of the electrical power.

It is to be understood that both the foregoing general description and the following detailed description are exem-plary and explanatory only, and are not restrictive of the present teachings.

BRIEF DESCRIPTION OF THE DRAWINGS

The disclosure will become more fully understood from the following detailed description, taken in conjunction with the accompanying figures, wherein like reference numerals refer to like elements unless otherwise indicated, in which.

DETAILED DESCRIPTION

Figure 1:
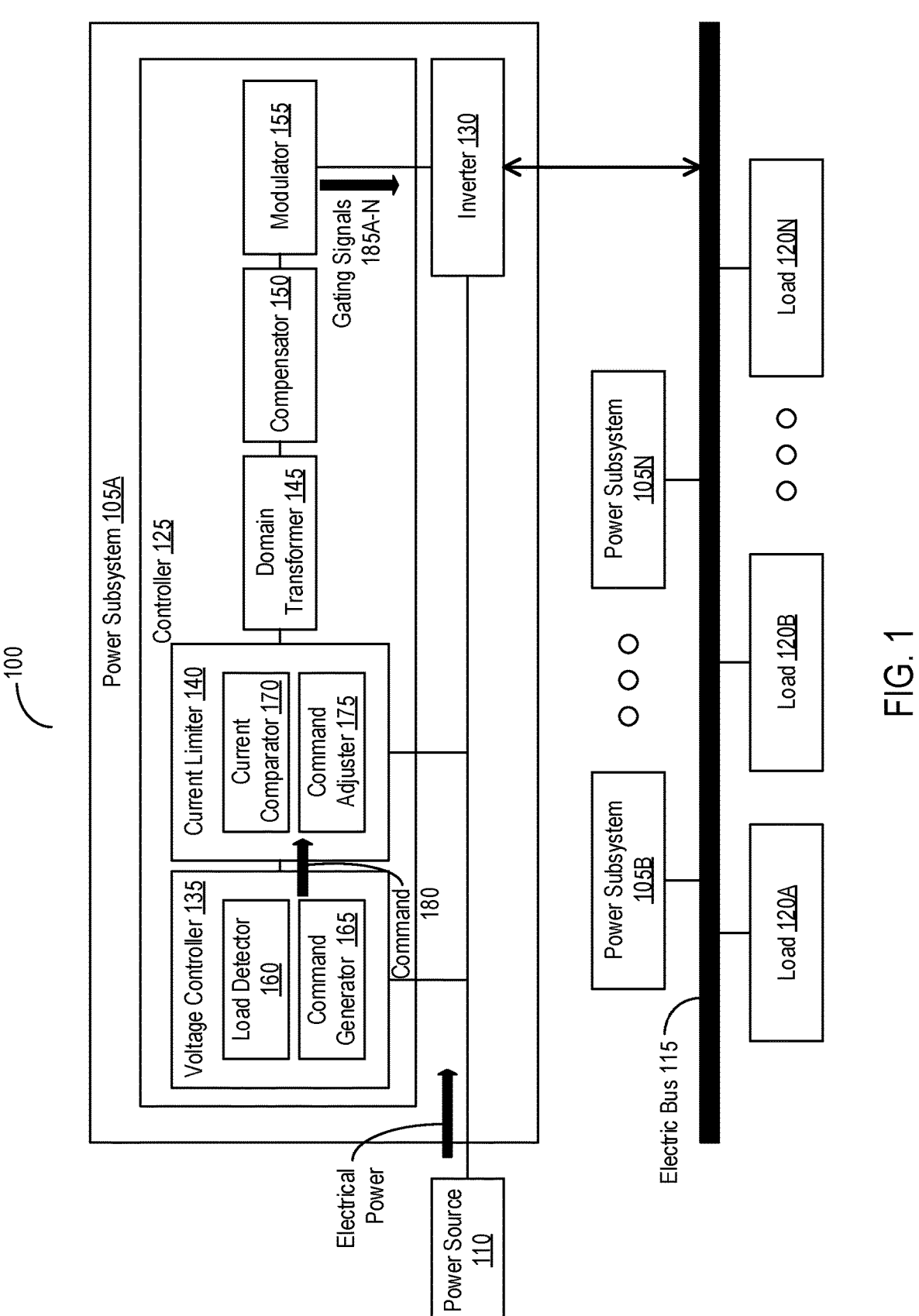
FIG. 1 depicts a block diagram of a system for inverter control with voltage modulation and current limiting in accordance with an illustrative embodiment.

Following below are more detailed descriptions of various concepts related to, and implementations of, systems, meth-ods, apparatuses, and devices for inverter control with voltage modulation and current limiting. The various con-cepts introduced above and discussed in greater detail below may be implemented in any of a number of ways, as the described concepts are not limited to any particular manner of implementation. Examples of specific implementations and applications are provided primarily for illustrative pur-poses.

A power subsystem can convey electrical power between a power source (e.g., a battery, generator set, a renewable power plant, or mixed fuel source) and one or more loads or components electrically coupled with the power source. A power subsystem containing a controller and a power inverter may be electrically coupled between the power source and the load to facilitate conveyance of electrical power. The power inverter may can perform direct current (DC) to alternating current (AC) (DC/AC) conversion (or AC/AC, DC/DC or AC/DC conversion) on the electrical power between the power source and the load. The control-ler may modify various characteristics of the AC electrical power conveyed through the power inverter, such as an amplitude, frequency, or phase. The controller may also configure various functionalities of the power inverter in performing the conversion.

Although this architecture can achieve conveyance of the electrical power, the power subsystem when coupled in parallel with multiple instances of power subsystems rela-tive to the loads may suffer from instability. To achieve the same characteristics for the output electrical power, the power subsystem may have to undergo significant tuning and other adjustments. This may be exacerbated by the fact that both the voltage, current, and phase control components within the controller can be extremely sensitive to input parameters. For example, changes to the parameters to tune the control loops for voltage control in the controller made it difficult to configure the current control portion. The current control loop may be very rigid in performance, and even slight adjustments to the parameters may lead to great disturbances in the output electrical power.

One approach to addressing these problems may entail an inclusion of a virtual impedance component between the power source and the load in the power subsystem. The virtual impedance component may include a low pass filter to suppress burst or unstable electrical power output. The inclusion of such a component, however, may result in additional hardware leading to higher bulkiness and increased complexity to the power subsystem. In addition, the filter in the virtual impedance component may be sus-ceptible to sensitivity to tuning inputs. Another approach aimed at addressing the issue with output power stability may involve the use of a switch between a grid-forming and grid-following configuration for the power subsystem. But this approach may be limited in scenarios where the electric bus is already stable and controlled. In addition, the switch may impose problems when the grid experiences transitions between forming and following, with a lack of stable output and now input remaining during such transitions.

To address the and other technical challenges, the con-troller for the inverter may use a single proportional-integral (PI) voltage control loop. The PI voltage control loop may be configured to engage phase locked loop (PLL) for syn-chronization to a live bus upon startup of the inverter. The PI voltage control loop may then use normal modulation and disengage PLL after completion of the startup to achieve phase control as specified by a frequency droop control. In addition, the controller may include a current control loop may provide current limiting. The current control loop may be configured to take over from the voltage control to regulate the output to a desired maximum current, when an over-current condition occurs. The controller may also include an imbalanced load to compensate for three-phase (e.g., A-phase, B-phase, and C-phase) electric power. With this architecture, the controller can be easier to tune, with simple PI loops for P (proportional) and I (integral) gains, with one for voltage control, one for current limiter, and another for the imbalanced load. The controller may also be independent of an inverter current or voltage sense, thereby reducing hardware complexity and bulk.

Referring now to FIG. 1, depicted is a block diagram of a system 100 for inverter control with voltage modulation and current limiting. In brief overview, the system 100 may include one or more power subsystems 105A-N (hereinafter generally referred as power subsystems 105), at least one power source 110, at least one electric bus 115, and one or more loads 120A-N (hereinafter generally referred to as loads 120), among others. At least one power subsystem 105 (e.g., the power subsystem 105A as depicted) may be structured to be electrically coupled with the power source 110. The power subsystem 105 may include at least one controller 125 and at least one inverter 130, among others. The controller 125 (sometimes herein referred to as a control, a control unit, or a device) may include at least one voltage controller 135, at least one current limiter 140, at least one domain transformer 145, at least one compensator 150, and at least one modulator 155, among others. The voltage controller 135 may include at least one load detector 160 and at least one command generator 165. The current limiter 140 may include at least one current comparator 170 and at least one command adjuster 175.

Components of the power subsystem 105, such as the controller 125 can be implemented using circuitry. The circuitry can include logic or machine-readable instructions to define the behavior, functions, and operations of the controller 125. The circuitry may be implemented by computer readable media which may include code written in any programming language including, but not limited to, Java, JavaScript, Python or the like and any conventional procedural programming languages, such as the "C" programming language or similar programming languages.

The processors in the power subsystem 105 can communicate with one or more remote processors. The remote processors may be connected to each other through any type of network (e.g., a CAN bus, etc.). The memory (e.g., RAM, ROM, Flash Memory, hard disk storage, etc.) may be a computer-readable medium to store data or computer code for facilitating the various processes described herein. The memory may be communicably connected to the processing circuitry to provide computer code or instructions for executing at least some of the processes described herein. The memory may be or include tangible, non-transient volatile memory or non-volatile memory and may include database components, object code components, script components, or any other type of information structure for supporting the various activities and information structures described herein.

The power source 110 can generate, output, or otherwise provide electrical power. The power source 110 can include or correspond to any source of the electrical power for the system 100. The power source 110 may include, for example, a generator set, a microgrid, a renewable fuel source (e.g., a photovoltaic array, a generator coupled with hydraulic turbine, or a wind power generator), a modular reactor, a power station, or a power interface coupled with an external power component, among others. The power source 110 can be structured to be electrically coupled with the power subsystem 105 (e.g., via a bus or connector). The power source 110 can be electrically coupled with the electrical bus 115 (e.g., via the controller 125 of the power subsystem 105) to convey, send, or otherwise deliver the electrical power. In the depicted example, the power source 110 may deliver the electrical power to the voltage controller 135 and the current limiter 140 of the controller 125 and the inverter 130 in the power subsystem 105.

The electrical power provided by the power source 110 to the power subsystem 105 (or another electrically coupled component) can be direct current (DC) power or an alternating current (AC) power. For example, the power source 110 may also be a wind power generator to produce DC power to the power subsystem 105. The power source 110 may be a generator set to produce AC power to the power subsystem 105. In some embodiments, the power source 110 may be part of the same apparatus, device, or component as the power subsystem 105. In some embodiments, the power source 110 may be separate from the power subsystem 105. For example, the power subsystem 105 can be physically separate from the power source 110 and be electrically coupled with the power source 110 via an electrical bus connection.

Each power subsystem 105 may be structured to be coupled with at least one of the power sources 110. Each power subsystem 105 may be structured to be coupled with the electric bus 115 in parallel with at least one other power subsystem 105. For instance, the power subsystem 105A and the power subsystem 105B may be electrically connected in parallel with the electric bus 115. The power subsystem 105 may can convey or pass the electrical power between the power source 110 and the electric bus 115 (and the loads 120 via the electrical bus 115). When the power source 110 is discharging to one of the loads 120 coupled with the electric bus 115, the power subsystem 105 may accept, obtain, or otherwise receive the electrical power drawn from the power source 110. Conversely, when charging from one of the components (e.g., the load 120) on the electric bus 115, the power subsystem 105 may accept, obtain, or otherwise the electrical power from the external source to be directed to charge a power storage (e.g., batteries of the power source 110).

The power subsystem 105 and the coupled power source 110 may initially be disconnected from the electrical bus 115. The functionality of the power subsystem 105 and the components therein (e.g., the controller 125) may depend on whether the power subsystem 105 is connected or disconnected. When first connected to form a connection between the power subsystem 105 and the electric bus 115, the power subsystem 105 may perform operations to initialize synchronize of the electrical power between the power source 110 and the electric bus 115. After completion of synchronization, the power subsystem 105 may perform operations to maintain synchronization (e.g., normal modulation) of the electrical power between the power source 110 and the electric bus 115 through the power subsystem 105. The functionalities of the power subsystem 105 and the components therein are detailed herein below.

In the controller 125, the voltage controller 135 executing on the controller 125 may regulate, manage, or otherwise control voltage of the electrical power using at least one proportional-integral (PI) loop. The voltage controller 135 may be structured to be coupled with the power source 110 or the inverter 130 to pass the electrical power between the power source 110 and the inverter 130. The electrical power may correspond to or have of a set of voltage components in a domain. For example, the electrical power from the power source 110 may be defined in terms of a direct (D) component, quadrature (Q) component, and zero (0 or Z) component in the DQ0 domain. The electrical power may have been transformed from another domain by another module in the power subsystem 105. For instance, the electrical power may be converted from an A-phase, B-phase, C-phase components in the ABC domain to the DQ0 domain to be processed by the voltage controller 135.

The load detector 160 of the voltage controller 135 may monitor for initiation of connection between the inverter 130 and the electric bus 115 to convey the electric power. In some embodiments, the load detector 160 may monitor for initiation of synchronization between the inverter 130 and the electric bus 115. Initially, the electric power at the power source 110 may not be in synchronization with the electric power from the electric bus 115. For example, the amplitude, frequency, or phase of the electric power at the power source 110 may differ from the amplitude, frequency, or phase of the electric power on the electric bus 115, and hence lack of synchronization between the two. The load detector 160 may measure a change in voltage, current, or power between the inverter 130 and the electric bus 115 to monitor for initialization, commencement, or a start of the connection. From monitoring, the load detector 160 may identify or determine whether the inverter 130 becomes electrically coupled with the electric bus 115. The determination may be performed at a sampling rate.

When the inverter 130 remains disconnected from the electric bus 115, the load detector 160 may continue to monitor for the initiation of the connection. Conversely, when the inverter 130 first becomes connected with the electric bus 115, the load detector 160 may determine, identify, or otherwise detect the initiation of connection between the inverter 130 and the electric bus 115. In some embodiments, the load detector 160 may determine that the connection is initiated, upon receiving an external command signal to connect the power subsystem 105 with the electric bus 115. In addition, the load detector 160 may determine, identify, or otherwise detect the initiation of synchronization between the inverter 130 and the electric bus 115, upon detection of the initiation of the connection. The load detector 160 may call, relay, or otherwise invoke other components in the controller 125 to initiate synchronization to match the amplitude, frequency, or phase of the electric power at the power source 110 with the amplitude, frequency, or phase respectively of the electric power on the electric bus 115.

In regulating the voltage of the electrical power, the load detector 160 may select or identify at least one voltage component of the set of voltage components. The load detector 160 may set the remaining voltage component to a defined value (e.g., null). For example, the load detector 160 may select the direct (D) component of the set of voltage components, while ignoring or setting the quadrature (Q) and zero (0) components of the voltage to null. In some embodiments, the load detector 160 may retrieve, receive, or otherwise identify at least one feedback from another component in the power subsystem 105, such as the inverter 130, or a sensing component on the electric bus 115. The feedback may include or identify a load compensation or a frequency droop compensation measure. The load compensation (sometimes herein referred to as amplitude droop) may identify an amount of voltage to adjust in accordance with a voltage droop control. The frequency compensation may identify an amount of frequency to adjust in accordance with frequency droop control.

The command generator 165 of the voltage controller 135 may produce, determine, or otherwise generate at least one inverter command 180. The inverter command 180 may be generated based on the voltage component (e.g., direct (D) component) in accordance with a single proportional-integral (PI) control loop of the voltage controller 135. The inverter command 180 may be for the selected voltage component, and may direct, signal, or otherwise indicate an amount of voltage to be set or modified for the voltage component. For instance, the inverter command 180 may indicate a value of voltage along the D component in the DQ0 domain. In some embodiments, the command generator 165 may adjust, modify, or otherwise determine the inverter command 180 based on the feedback, such as the load compensation or frequency droop compensation. In some embodiments, the command generator 165 may modify or generate the inverter command 180 based on the feedback identifying frequency droop compensation. In some embodiments, the command generator 165 may modify or generate the inverter command 180 based on the feedback identifying load compensation for the selected voltage component.

When the initiation of the connection or synchronization is detected, the command generator 165 may activate, enable, or otherwise engage a phase locked loop (PLL) control on the electric power conveyed via the inverter 130. The PLL control may be engaged to synchronize the inverter 130 with the electric bus 115. The PLL may be performed to reduce or eliminate the differences in phase between the voltage of the electric power at the inverter 130 (or at the power source 110) and the voltage of the electric power on the electric bus 115. The command generator 165 may output, produce, or otherwise generate the command signal 180 to activate, enable, or otherwise engage the PLL control on the voltage of the electric power. Upon generation, the command generator 165 may send, forward, or otherwise provide the inverter command 180 to the current limiter 140.

Subsequently, the load detector 160 may monitor for completion of synchronization between the inverter 130 and the electric bus 115, as the PLL control is engaged on the electric power conveyed via the inverter 130. To monitor, the load detector 160 may measure, acquire, or otherwise identify an amplitude, a frequency, and a phase of the electric power (or voltage or current) at the inverter 130 (or the power source 110). The load detector 160 may measure, acquire, or otherwise identify an amplitude, a frequency, and a phase of the electric power (or voltage or current) on the electric bus 115. The load detector 160 may compare the amplitudes, the frequencies, and the phases of the electric power at the inverter 130 and the electric bus 115 to determine a difference metric. The difference metric may identify a degree of deviation between the amplitudes, the frequencies, and the phases of the electric powers respectively.

With the identification, the load detector 160 may determine whether the difference metric satisfies a threshold. The threshold may identify or delineate a value for the difference metric at which the electric power at the inverter 130 (or the power source 110) is determined to be synchronized with the electric power on the electric bus 110. The threshold may, for example, correspond to a 1-5% difference between the amplitudes, the frequencies, and the phases of the electric power at the inverter 130 and the electric bus 115. If the difference metric satisfies (e.g., is less than or equal to) the threshold, the load detector 160 may determine that the connection or synchronization between the inverter 130 and the electric bus 115 is complete. Otherwise, if the difference metric does not satisfy (e.g., greater than) the threshold, the load detector 160 may determine that the synchronization or connection is incomplete. In addition, the load detector 160 may continue to monitor the synchronization between the inverter 130 and the electric bus 115.

When the completion of the connection or synchronization is detected, the command generator 165 may deactivate, disable, or otherwise deactivate the PLL control on the electric power conveyed via the inverter 130. The PLL control may be disengaged, once the synchronization of the inverter 130 (or the power source 110) with the electric bus 115 is complete. At this point, the differences in amplitudes, the frequencies, and the phases of the electric power between the inverter 130 and the electric bus 115 may be zero or substantially zero (e.g., less than 1-5%). The command generator 165 may output, produce, or otherwise generate the inverter command 180 to deactivate, disable, or otherwise disengage the PLL control on the voltage of the electric power. In some embodiments, the command generator 165 may change, adjust, or otherwise modify the inverter command 180 to deactivate, disable, or otherwise disengage the PLL from the engaged state. The command generator 165 may output, produce, or otherwise generate the inverter command 180 to use or apply normal modulation for the inverter. Upon generation, the command generator 165 may send, forward, or otherwise provide the inverter command 180 to the current limiter 140.

The current limiter 140 executing on the controller 125 may regulate, manage, or otherwise control the current of the electrical power using at least one proportional-integral (PI) loop. The current limiter 140 may be structured to be coupled with the power source 110 or the inverter 130 to pass the electrical power between the power source 110 and the inverter 130. The current limiter 140 may be structured to be coupled with the voltage controller 135 to receive the inverter command 180 from the command generator 165 of the voltage controller 135. The electrical power may correspond to or have of a set of current components in at least one domain. The set of components for the current of the electric power may be defined in terms of: a direct (D) component, quadrature (Q) component, and zero (0 or Z) component in the DQ0 domain or an A-phase, B-phase, C-phase components in the ABC domain.

The current comparator 170 of the current limiter 140 may identify or determine whether the current of the electric power for the inverter 130 exceeds an over-current threshold. The over-current threshold may delineate or define a value for the current (or current components defined in the DQ0 or ABC domain) at which an over-current condition is to occur at the power subsystem 105. The current comparator 170 may measure, acquire, or identify the current of the electric power for the inverter 130. In some embodiments, the current comparator 170 may identify values of a set of current components in at least one domain for the current of the electric power. For instance, the current comparator 170 may measure the values of the current along the direct (D) component, quadrature (Q) component, and the zero (0) component in the DQ0 domain. The current limiter 140 may regulate or control the current of the electric power in accordance with the PI loop based on feedback identifying the set of current components for the current of the electric power.

With the identification, the current comparator 170 may compare the current with the over-current threshold. If the current exceeds the over-current threshold, the current comparator 170 may identify, determine, or otherwise detect the occurrence of the over-current condition in the electric power. In some embodiments, if at least one of the current components exceeds the over-current threshold for the component in the domain, the current comparator 170 may detect the occurrence of the over-current condition in the electric power. The domain compared for the current components may be the same as or differ from the domain in which the voltage component for the inverter command 180 is defined. For instance, the domain for comparison of the current may be in ABC domain, whereas the voltage component for the inverter command 180 may be the direct (D) component in the DQ0 domain. On the other hand, if the current does not exceed the over-current threshold, the current comparator 170 may identify, determine, or otherwise detect an absence of the over-current condition in the electric power. In some embodiments, if none of the current components exceeds the over-current threshold for the component in the domain, the current comparator 170 may detect the absence of the over-current condition in the electric power.

The command adjuster 175 of the current limiter 140 may determine whether to adjust, modify, or otherwise recalculate the inverter command 180 based on the comparison of the current of the electric power with the over-current threshold. The determination may be based on determination of whether the current of the electric power for the inverter 130 exceeds the over-current threshold. The inverter command 180 may be independent of whether to engage or disengage the PLL control on the electric power at the inverter 130. When the current is determined to be under the over-current threshold, the command adjuster 175 may maintain the inverter command 180 as is from the voltage controller 135. In some embodiments, when none of the current components are over the over-current threshold or when the over-current condition is absent, the command adjuster 175 may maintain the inverter command 180. In maintaining, the command adjuster 175 may also forward or pass the inverter command 180 to another component (e.g., the domain transformer 145 as depicted) in the controller 125.

In contrast, when the current is determined to exceed the over-current threshold, the command adjuster 175 may determine to modify, adjust, or otherwise recalculate the inverter command 180. In some embodiments, when at least one of the current components exceeds the over-current threshold for the component or when the over-current condition is present, the command adjuster 175 may determine to modify or adjust the inverter command 180. The inverter command 180 for the selected voltage component in the maintained may be modified to maintain the electrical power. For instance, with the value of the exceeding the over-current threshold, the command adjuster 175 may reduce the voltage component specified by the inverter command 180 to maintain a target or same level of electrical power. In some embodiments, the command adjuster 175 may recalculate or re-determine the inverter command to maintain a target power for the electrical power. With the recalculation, the command adjuster 175 may send, forward, or otherwise the inverter command 180 to another component (e.g., the domain transformer 145 as depicted) in the controller 125.

The domain transformer 145 executing on the controller 125 may convert, transform, or otherwise transform the inverter command 180 from one domain to another domain. The domain transformer 145 may be structured to be coupled with the current limiter 140 to retrieve, identify, or otherwise receive the inverter command 180. The inverter command 180 may be for the selected voltage component of the set voltage components in one domain, with the remaining voltage components assigned or set to a defined value (e.g., null). For example, the inverter command 180 may specify the value for the direct (D) component of the voltage, with the quadrature (Q) component and zero (0) component set to null in the DQ0 domain.

Upon receipt, the domain transformer 145 may determine or identify the domain (e.g., DQ0 domain) in which the inverter command 180 is defined. The domain transformer 145 may select or identify a target domain (e.g., ABC domain) to which to convert the inverter command 180. With the identification, the domain transformer 145 may perform the domain transformation from the original domain to the target domain. In performing, the domain transformer 145 may calculate, generate, or otherwise determine the value for each component in the set of components in the target domain for the inverter command 180. The inverter command 180 in the target domain may include a value for each component (e.g., A-phase, B-phase, and C-phase).

The compensator 150 executing on the controller 125 may perform or apply a compensation value to the set of components of the inverter command 180. The compensation value may identify or correspond to a bias to the value of each voltage component of the inverter command 180 in accordance with an imbalanced load. The imbalanced load may be used to further tune the electric power at the inverter 130 in the domain (e.g., ABC domain) to be in synchronization with the electric power on the electric bus 115. The compensator 150 may regulate or control the set of voltage components of the inverter command 180 in accordance with at least one PI loop. In applying, the compensator 150 may adjust, modify, or otherwise set the value of each voltage component of the inverter command based on the compensation bias for each component. With the modification, the compensator 150 may send, forward, or otherwise provide the inverter command 180 to another component (e.g., the modulator 155) of the controller 125.

The modulator 155 executing on the controller 125 may produce, output, or otherwise generate a set of gating signals 185A-N (hereinafter generally referred to gating signals 185) using the inverter command 180. The set of gating signals 185 may be used to apply the inverter command 180 to the inverter 130. Each gating signal 185 may be a pulse width modulated (PWM) signal to be provided to a corresponding leg of the inverter 130 and may be used to direct or control the DC/AC conversion of the electric power conveyed between the power source 110 and the electric bus 115 through the inverter 130. The modulator 155 may convert, transform, or otherwise translate the set of components (e.g., A-phase, B-phase, and C-phase) in the inverter command 180 to the set of PWM signals corresponding to the gating signals 185.

The modulator 155 may retrieve, identify, or otherwise receive at least one phase to be used for the set of gating signals 185. When the PLL control is engaged during the synchronization between the inverter 130 and the electric bus 115, the modulator 155 may modify, adjust, or otherwise set the phase of the set of gating signals 195 using the phase specified by the PLL control. In some embodiments, the modulator 155 (or another component in the power subsystem 105) may calculate or determine the phase to be used in accordance with the PLL control. The PLL control may include, for example: at least one variable frequency oscillator, at least one filter, at least one phase detector, and at least one feedback loop to adjust the frequency to match the phase of the electrical power via the inverter 130 with the phase of the electric power on the electric bus 115. Otherwise, when the PLL control is disengage after the completion of the synchronization, the modulator 155 may maintain or pass the set of gating signals 195 initially determined using the inverter command 180. With the generation, the modulator 155 may send, forward, or provide the gating signals 185 corresponding to the inverter command 180 to the inverter 130.

The inverter 130 (sometimes herein referred to as a power inverter or rectifier) may convey the electrical power between the power source 110 and the electrical bus 115. The inverter 130 may be structured to be coupled with the power source 110 and the electrical bus 115. The inverter 130 may also be structured to be coupled with the controller 125 in the power subsystem 105. The inverter 130 may obtain, accept, or otherwise receive the set of gating signals 185. The inverter 130 may include a set of legs to receive the corresponding set of gating signals 185. The inverter 130 may be structured coupled with the modulator 155 to receive the set of gating signals 185. Each leg of the inverter 130 can correspond to a phase of the AC electrical power to be delivered. For example, the inverter 130 can include four legs, three for A-phase, B-phase, and C-phase and the remaining fourth for a reference signal. Although described having three-legs, in various embodiments, the inverter 130 can have any number of legs.

Using the gating signals 185, the inverter 130 may transform or convert the electrical power from AC to DC (e.g., using an active rectifier). In some embodiments, the inverter 130 can transform the electrical power from DC to AC. As discussed above, the electrical power may be passed through the power subsystem 105 in either direction. The inverter 130 may be electrically coupled between the power source 110 and the electric bus 115 in series configuration (e.g., as depicted) or parallel, or in any combination. The inverter 130 may be electrically coupled with the electric bus 115 in parallel with another power subsystem 105 (e.g., as depicted).

Upon transformation, the inverter 130 can convey, send, or otherwise provide the electrical power (e.g., in the form of AC) to the one or more loads 120 via the electric bus 115. The inverter 130 can include one or more components, such as an inverter and rectifier, and any combination thereof, to perform the DC to AC conversion. In some embodiments, the inverter 130 can feed forward or provider the AC electrical power corresponding to the set of gating signals 185 to the electric bus 115. The load 120 electrically coupled with the electric bus 115 can include or correspond to any component electrically coupled with the power subsystem 105 to use, spend, or otherwise consume the electrical power originating from the power subsystem 105. The load 115 can include, for example, analog electronics, computer devices, and electric vehicles, among others, among others.

While the features are described as being performed by individual sub-components (e.g., the voltage controller 135, the current limiter 140, the domain transformer 145, the compensator 150, and the modulator 155 of the controller 125, among others), in various implementations the features may be performed by the processor and can be implemented via one or more of the other elements of memory or different elements. For example, the processor of the controller 125 (or the power subsystem 105) can execute instructions defining the voltage controller 135, the current limiter 140, the domain transformer 145, the compensator 150, and the modulator 155, among others as stored and maintained on the memory.

Figure 2:
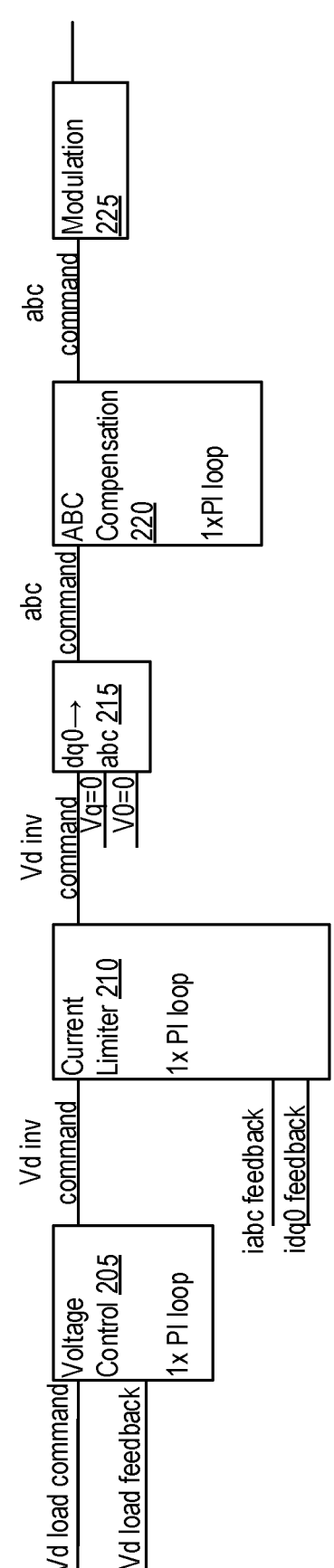
FIG. 2 depicts a block diagram of a device for inverter control with voltage modulation and current limiting in accordance with an illustrative embodiment.

Referring now to FIG. 2, depicted is a block diagram of a device 200 for inverter control with voltage modulation and current limiting. The device 200 may be part of may include one or more of the components in the system 100. In brief overview, the device 200 may include at least one voltage control 205, at least one current limiter 210, at least one domain converter 215 (dq0 to ABC), at least one compensation load 220, and at least one modulator 225, among others. The device 200 itself may be electrically coupled with the a power source and a power inverter, among other components.

The voltage control 205 may regulate voltage components of the electric power using at least one proportional (P) integral (I) control loop. The voltage control 205 may have a direct component voltage load command (Vd load command) and a direct component voltage load feedback (Vd load feedback) as inputs. The direct component voltage load command may be received from an amplitude droop control. The direct component voltage load feedback may be received from a power meter measuring the voltage at the inverter. Using the inputs, the voltage control 205 may output or generate a direct component voltage inverter command (Vd inv command) according to PI control loop. From the inputs, the voltage control 205 may determine whether synchronization between the inverter and an output electric bus is initializing or complete. When synchronization is initiating, the voltage control 205 may engage phase locked loop (PLL). Otherwise, when synchronization is complete, the voltage control 205 may disengage phase locked loop (PLL). With the generation, the voltage control 205 may feed the inverter command to the current limiter 210.

The current limiter 210 may have regulate current component of the electric power using at least one PI control loop. The current limiter 210 may have first feedback identifying a set of components in the ABC domain (iabc feedback) second feedback identifying a set of components in the DQ0 domain (idq0 feedback) as inputs. The first and second feedbacks may be received from a power meter measuring the current components at the inverter. In conjunction, the current limiter 210 may obtain the inverter command from the voltage control 205. By comparing the input current components with over-current thresholds, the current limiter 210 may determine an over-current condition is present in the electric power. If the over-current condition is absent, the current limiter 210 may maintain the inverter command. Conversely, if the over-current condition is present, the current limiter 210 may adjust the inverter command to maintain a target power for the electric power through the inverter. The current limiter 210 may pass the inverter command forward to the domain converter 215.

The domain converter 215 may transform the inverter command for the direct component voltage, with the quadrature component and zero components set to null, from the DQ0 domain to the ABC domain (abc command). The transformed command may identify values for the voltage components in the ABC domain, such as A-phase, B-phase, and C-phase. With the conversion, the domain converter 215 may forward the transformed inverter command to the compensation load 220. The compensation load 220 may apply a compensation bias to account for imbalanced load between the inverter and the electric bus to the inverter command, and forward the command to the modulator 225. The modulator 225 may translate the inverter command into a set of gating signals to provide to a corresponding set of legs of the inverter.

Figure 3A:
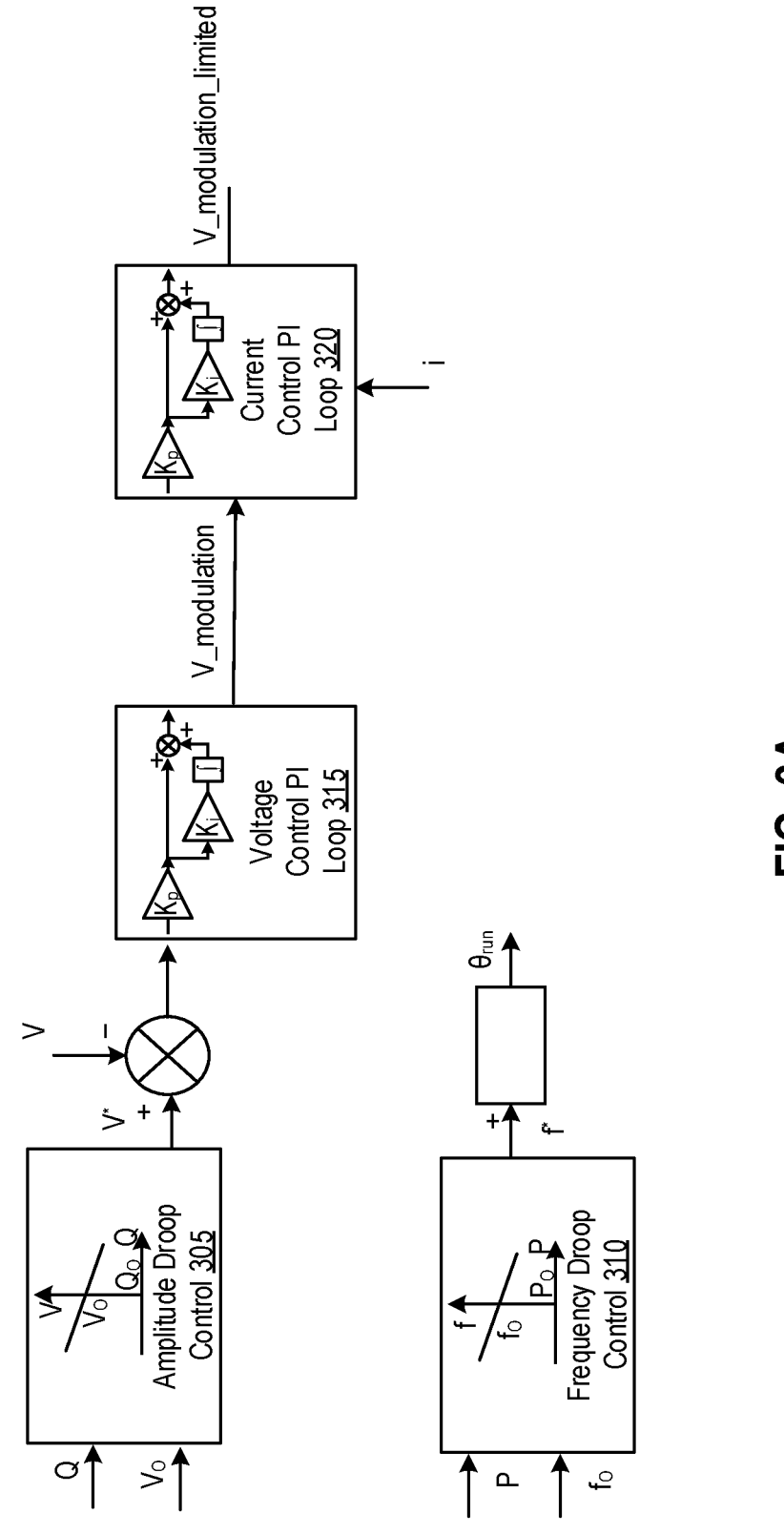
FIGS. 3A and 3B depict a circuit diagram of a power subsystem with inverter control for voltage modulation and current limiting in accordance with an illustrative embodi-ment.
Figure 3B:
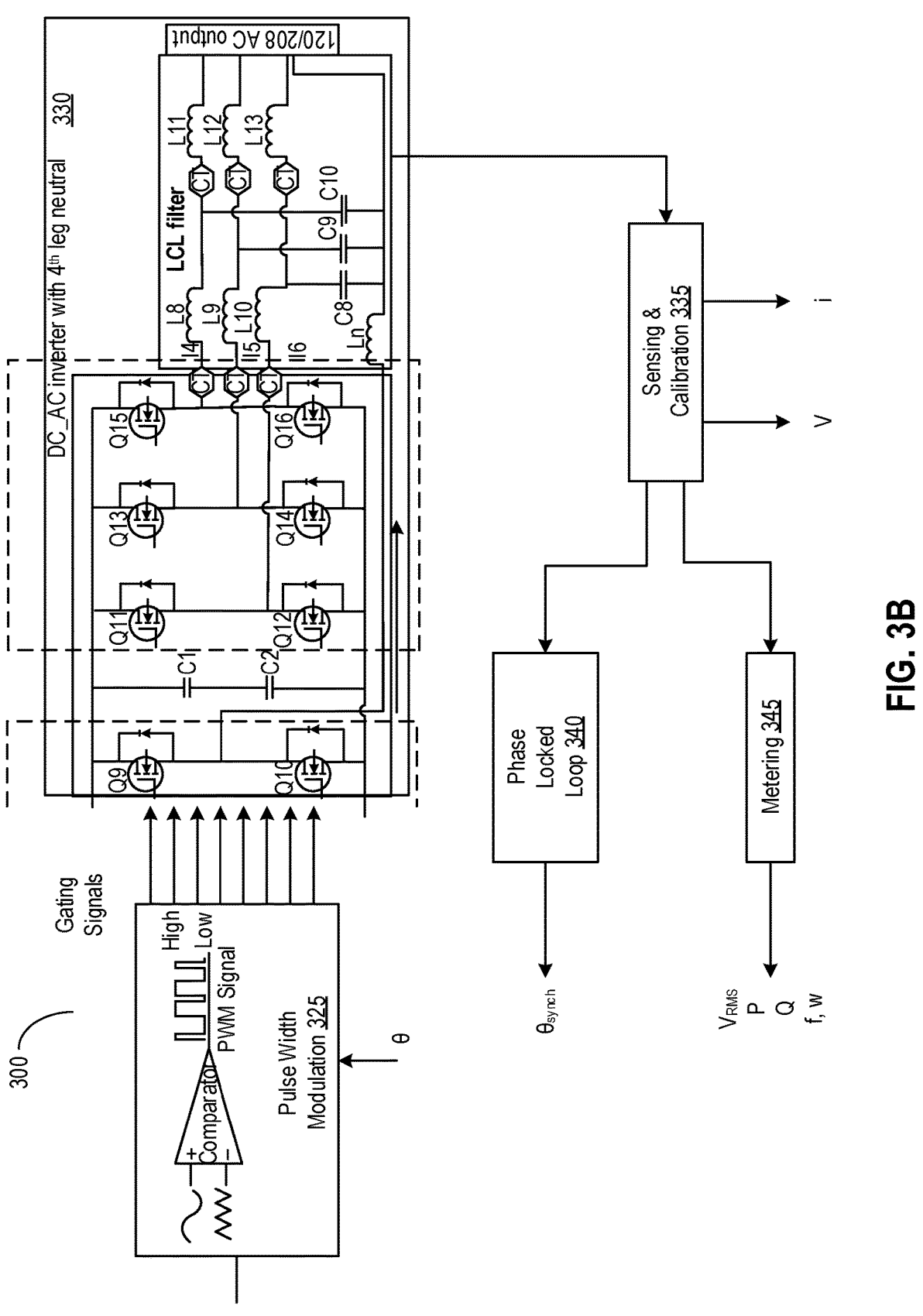

Referring now to FIGS. 3A and 3B, depicted is a circuit diagram of a power subsystem 300 with inverter control for voltage modulation and current limiting. The power subsystem 300 may be part of or can be include one or more of the components in the system 100 or the device 200. Starting from FIG. 3A, the power subsystem 300 may include one or more components to receive direct current (DC) electrical power from a power source for conversion into alternating current (AC) electrical power to provide to components electrically coupled with the power system 300.

The power subsystem 300 may include at least one amplitude droop control 305 and at least one frequency droop control 310. The amplitude droop control 305 can modify or regulate an amplitude of a voltage of the electrical power received from the power source in accordance with a droop characteristic specified for the amplitude. The amplitude droop control 305 can maintain the amplitude to a target amplitude for the output electrical power. The amplitude droop control 305 can feed the output forward to a voltage multiplier to modify (e.g., via multiplication with a configured input) the output voltage. The frequency droop control 310 can modify or regulate a frequency or phase of the electrical power in accordance with a droop characteristic specified for the frequency. The frequency droop control 310 may feed forward an output frequency forward to a control unit. The control unit in turn may calculate or generate a phase ($\theta_{run}$) to set a phase for the modulation of the output signal.

The power subsystem 300 may include at least one voltage control proportional (P) and integral (I) loop 315 and at least one current control PI loop 320, among others. The voltage PI loop 315 can accept, obtain, or otherwise receive the output from the amplitude droop control 305 via the voltage multiplier and the output from the frequency droop control 310 via the frequency mixer. The voltage PI loop 315 can further regulate the voltage of the electrical power and to output an inverter command signal. The voltage PI loop 315 can feed the output inverter command forward to the current multiplier to modify (e.g., via multiplication with a configured input) the output current. The current control PI loop 320 can accept, obtain, or otherwise receive the output from the voltage control PI loop 315 via the current 414. The current control PI loop 320 can further regulate the current of the electrical power received at the gate forming control. From regulating, the current control PI loop 315 produce, output, or otherwise generate an output inverter command signal.

Moving onto FIG. 3B, the power subsystem 300 may include at least one pulse width modulation unit 325 and at least one inverter 330. The pulse width modulation unit 325 can accept, obtain, or otherwise receive the output from the voltage control PI loop 315 and the current control PI loop 320. The output may include the inverter command converted from one domain (e.g., DQ0 domain) to a target domain (e.g., A-phase, B-phase, and C-phase). Using the inverter command, the pulse width modulation unit 325 can produce, output, or otherwise generate a set of gating signals. The pulse width modulation 325 can feed or provide the set of gating signals to a set of corresponding inputs or legs of the inverter 330.

The inverter 330 may accept, obtain, or otherwise receive the set of gating signals from the pulse width modulation unit 325. The inverter 330 can include a set of switch banks and at least one filter. The set of switch banks can correspond to the set of legs or inputs for the inverter 330, and can perform processing (e.g., DC to AC conversion) for the inverter 330. The filter can filter out or suppress harmonics of the current absorbed by the inverter 330 from reaching other components to which the electrical power is to be delivered. Using the set of gating signals, the inverter 330 may perform DC to AC conversion.

The power system 300 can include at least one sensing and calibration unit 335, at least one phase locked loop 340, and at least one metering unit 345, among others. The sensing and calibration unit 335 can provide instrumentation on the voltage and current of the electrical power of the output from the inverter 330. The phase locked loop 340 may include, for example: at least one variable frequency oscillator, at least one filter, at least one phase detector, and at least one feedback loop to adjust the frequency to match the phase of the electrical power via the inverter 330 with the phase of the electric power on the electric bus. The phase locked loop 340 may provide a phase (@synch) for the electrical power of the output. The metering unit 345 can gather other information about the electrical power of the output.

Figure 4:
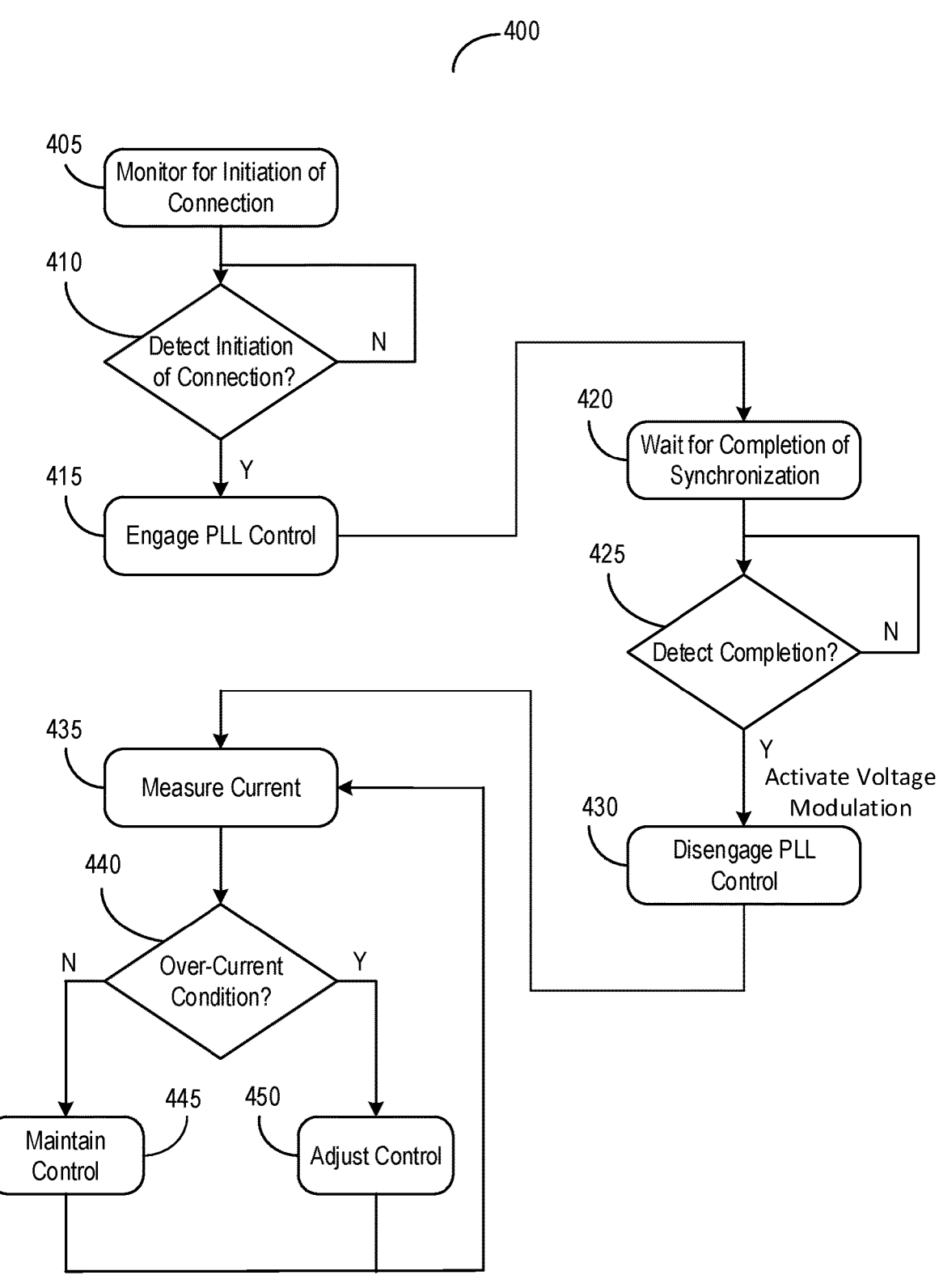
FIG. 4 depicts a flow diagram of a method of stabilizing power output for a power inverter, in accordance with an illustrative embodiment.

Referring now to FIG. 4, depicted is a flow diagram of a method 400 of stabilizing power output for a power inverter. The method 400 can be implemented by or performed using any of the components discussed herein. In brief overview, under the method 400, a controller may monitor for initiation of connection (405). The controller may detect whether the connection is initiated (410). If the initiation of the connection is detected, the controller may engage phase locked loop (PLL) control (415). The controller may monitor for completion of synchronization (420). The controller may determine whether the synchronization is completed (425). If the synchronization is completed, the controller may disengage PLL control (430) The controller may measure a current (435). The controller may determine whether there is an over-current condition in the electric power (440). If the current does not exceed the threshold, the controller may maintain the voltage control (445). Otherwise, if the current does exceed the threshold, the controller may adjust the voltage control (450).

In further detail, a controller (e.g., the controller 125) may monitor for initiation of connection between an inverter (e.g., the inverter 130) and an output electric bus (e.g., the electric bus 115) (405). The inverter may be initially disconnected from the electric bus, and may then be electrically coupled with the electric bus. As a result, the electric power at the inverter may not be in synchronization with the electric power from the electric bus.

The controller may detect whether connection has started between the inverter and the external electric bus to output electrical power (410). To detect, the controller may monitor for a change in voltage, current, or power between the inverter and the electric bus. The change may be indicative of or correlate with the initialization of the connection. When the change is detected, the controller may determine that the connection has started. Otherwise, the controller may continue to monitor.

If the initiation of the connection is detected, the controller may activate, enable, or otherwise activate phase locked loop (PLL) control (415). The PLL control may be activated to stabilize the voltage of the electric power conveyed via the inverter. The PLL may be performed to reduce or eliminate the differences in phase between the voltage of the electric power at the inverter (or at the power source) and the voltage of the electric power on the electric bus. In activating, the controller may generate an inverter command (e.g., the inverter command 180) to indicate the activation of the PLL control. The PLL control may be on a voltage component of a set of voltage component in a domain (e.g., DQ0 domain). The controller may determine the inverter command to set a value for at least one voltage component based on feedback, such as amplitude droop compensation or frequency droop compensation, among others.

The controller may wait for completion of synchronization between the inverter and the electric bus (420). As the inverter command is passed to the inverter, the controller may convert the inverter command from one domain (e.g., DQ0 domain) to another domain (e.g., ABC domain). In addition, the controller may apply an imbalanced load over the set of voltage components.

The controller may identify or determine whether the synchronization is completed (425). To determine, the controller may measure the amplitude, frequency, or phase of the electric power at the inverter and the amplitude, frequency, or phase of the electric power on the electric bus. The controller may compare the amplitudes, frequencies, or phases of the measured electric power signals differ. If the amplitudes, frequencies, or phases of the measured electric power differ by more than a threshold, the controller may detect synchronization is not yet complete, and may continue monitoring. Otherwise, if the amplitudes, frequencies, or phases of the measured electric power differ by less than or equal to a threshold, the controller may detect the completion of the synchronization.

If the synchronization is completed, the controller may disable, deactivate, or otherwise disengage PLL control (430). In deactivating, the controller may generate an inverter command (e.g., the inverter command 180) to indicate the deactivation of the PLL control. The inverter command may indicate the use of normal modulation for the inverter. The controller may determine the inverter command to set a value for at least one voltage component based on feedback, such as amplitude droop compensation or frequency droop compensation, among others. The controller may also activate voltage modulation with the inverter command indicating the use of normal modulation.

The controller may acquire, identify, or otherwise measure a current corresponding to the electric power (435). The controller may identify a value in each component of a set of current components in at least one domain, such as the DQ0 domain or the ABC domain, among others. The controller may identify or determine whether there is an over-current condition in the electric power (440). The controller may compare the current components with the over-current thresholds to determine whether an over-current condition is present in the electric power. If any of the current component exceeds the over-current threshold, the controller may determine the presence of the over-current condition. Otherwise, if none of the current components exceed, the controller may determine the absence of the over-current condition.

If the over-current condition is absent, the controller may maintain the voltage control (445). The controller may maintain the voltage control to activate PLL control on at least one of the voltage components of the voltage for the electric power. The controller may pass the inverter command for engaging the PLL control. Otherwise, if the over-current condition is present, the controller may adjust the voltage control (450). The controller may modify or re-determine the voltage control to activate PLL control on at least one of the voltage components of the voltage for the electric power. The controller may adjust the inverter command for engaging the PLL control to maintain a target level of power for the electric power at the inverter.

While this specification contains various implementation details, these should not be construed as limitations on the scope of what may be claimed but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described as acting in certain combinations and even initially claimed as such, one or more features from a claimed combination can, in some cases, be excised from the combination, and the claimed combination may be directed to a subcombination or variation of a subcombination.

As utilized herein, the terms "substantially," "generally," "approximately," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the appended claims.

The term "coupled" and the like, as used herein, mean the joining of two components directly or indirectly to one another. Such joining may be stationary (e.g., permanent) or moveable (e.g., removable or releasable). Such joining may be achieved with the two components, or the two components and any additional intermediate components being integrally formed as a single unitary body with one another, with the two components, or with the two components and any additional intermediate components being attached to one another.

The terms "fluidly coupled to" and the like, as used herein, mean the two components or objects have a pathway formed between the two components or objects in which a fluid, such as air, reductant, an air-reductant mixture, exhaust gas, hydrocarbon, an air-hydrocarbon mixture, may flow, either with or without intervening components or objects. Examples of fluid couplings or configurations for enabling fluid communication may include piping, channels, or any other suitable components for enabling the flow of a fluid from one component or object to another.

It is important to note that the construction and arrangement of the various systems shown in the various example implementations is illustrative only and not restrictive in character. All changes and modifications that come within the spirit and/or scope of the described implementations are desired to be protected. It should be understood that some features may not be necessary, and implementations lacking the various features may be contemplated as within the scope of the disclosure, the scope being defined by the claims that follow.

Also, the term "or" is used, in the context of a list of elements, in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

Additionally, the use of ranges of values herein are inclusive of their maximum values and minimum values unless otherwise indicated. Furthermore, a range of values does not necessarily require the inclusion of intermediate values within the range of values unless otherwise indicated.

It is important to note that the construction and arrangement of the various systems and the operations according to various techniques shown in the various example implementations is illustrative only and not restrictive in character. All changes and modifications that come within the spirit and/or scope of the described implementations are desired to be protected. It should be understood that some features may not be necessary, and implementations lacking the various features may be contemplated as within the scope of the disclosure, the scope being defined by the claims that follow.

What is claimed is:

1. A device for inverter control, comprising:
   a computer-readable medium having instructions stored thereon; and
   at least one processor configured to execute the instructions to:
   monitor for an initiation of a connection between an inverter and an electrical bus, the connection to convey electrical power from a power source of a plurality of power sources to the electrical bus via the inverter, wherein the electrical bus is electrically coupled to the plurality of power sources to provide at least a subset of electrical power present on the electrical bus to at least one load;
   engage, responsive to detection of the initiation, phase locked loop (PLL) control on the electrical power conveyed via the inverter to synchronize the electrical power from the inverter with the electrical power present on the electrical bus;
   determine that a synchronization between the electrical power from the inverter and the electrical power present on the electrical bus is complete; and
   disengage, responsive to the determination that the synchronization is complete, the PLL control on the electrical power conveyed from the inverter to the electrical bus.

2. The device of claim 1, wherein the at least one processor is configured to execute the instructions to generate an inverter command to apply the PLL control on a voltage component of a plurality of voltage components of the electrical power based on a frequency droop compensation.

3. The device of claim 1, wherein the at least one processor is configured to execute the instructions to modify an inverter command to apply the PLL control on a voltage component of a plurality of voltage components of the electrical power based on a feedback identifying the voltage component of the electrical power.

4. The device of claim 1, wherein the at least one processor is configured to execute the instructions to pass an inverter command for a voltage component of a plurality of voltage components of the electrical power in a first domain, responsive to none of a plurality of current components of the electrical power in a second domain exceeding an over-current threshold.

5. The device of claim 1, wherein the at least one processor is configured to execute the instructions to recalculate an inverter command for a voltage component of a plurality of voltage components of the electrical power in a first domain to maintain the electrical power, responsive to at least one of a plurality of current components of the electrical power in a second domain exceeding an over-current threshold.

6. The device of claim 1, wherein the at least one processor is configured to execute the instructions to convert a first inverter command for a voltage component of a plurality of voltage component from a first domain with remaining components of the plurality of voltage components set to null, to generate a second inverter command in second domain.

7. The device of claim 1, wherein the at least one processor is configured to execute the instructions to apply compensation over a plurality of voltage components for an inverter command.

8. A method of stabilizing voltage output, comprising:

detecting, by a controller, an initiation of a synchronization between an inverter and an electrical bus to output electrical power from a power source of a plurality of power sources to the electrical bus via the inverter, wherein the electrical bus is electrically coupled to the plurality of power sources to provide at least a subset of electrical power present on the electrical bus to at least one load;

activating, by the controller, a phase locked loop (PLL) control on a voltage of the electrical power conveyed via the inverter to stabilize the voltage of the electrical power from the inverter to a voltage of the electrical power present on the electrical bus responsive to detection of the initiation;

waiting, by the controller, for a completion of synchronization between the voltage of the electrical power from the inverter and the voltage of the electrical power present on the electrical bus; and de-activating, by the controller, the PLL control on the voltage of the electrical power from the inverter to output from the inverter to the electrical bus.

9. The method of claim 8, wherein activating the PLL control further comprises generating an inverter command to indicate activation of the PLL control on a component of a plurality of components corresponding to the voltage based on a frequency droop compensation.

10. The method of claim 8, wherein deactivating the PLL control further comprises generating an inverter command to indicate deactivation of the PLL control on a component of a plurality of components corresponding to the voltage based on a load feedback for the component of the voltage.

11. The method of claim 8, further comprising maintaining, by the controller, determination of activation of the PLL control responsive to none of a plurality of components corresponding to a exceeding an over-current threshold.

12. The method of claim 8, further comprising re-determining, by the controller, activation of the PLL control responsive to at least one of a plurality of components corresponding to a current of the electrical power exceeding an over-current threshold.

13. The method of claim 8, further comprising applying, by the controller, an imbalanced load over a plurality of components corresponding to the voltage of the electrical power.

14. The device of claim 1, wherein to monitor for the initiation of the connection, the processor is configured to:

monitor electrical signals between the inverter and the electrical bus; and detect a change in the electrical signals indicative of the initiation of the connection between the inverter and the electrical bus.

15. The device of claim 1, wherein to monitor for the initiation of the connection and engage the PLL control, the processor is configured to:

monitor for an external command signal to connect the inverter with the electric bus; and engage, subsequent to reception of the external command signal, the PLL control on the electrical power conveyed via the inverter to synchronize the electrical power from the inverter with the electrical power present on the electrical bus.

\* \* \* \* \*